United States Patent
Jeong et al.

(10) Patent No.: US 7,288,453 B2
(45) Date of Patent: Oct. 30, 2007

(54) METHOD OF FABRICATING ANALOG CAPACITOR USING POST-TREATMENT TECHNIQUE

(75) Inventors: Yong-Kuk Jeong, Seoul (KR); Seok-Jun Won, Seoul (KR); Dae-Jin Kwon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/063,942

(22) Filed: Feb. 23, 2005

(65) Prior Publication Data
US 2005/0196915 A1  Sep. 8, 2005

(30) Foreign Application Priority Data
Feb. 24, 2004  (KR) ............... 10-2004-0012398

(51) Int. Cl.
*H01L 21/8234* (2006.01)
(52) U.S. Cl. ............ 438/238; 438/3; 438/240; 438/381; 257/E27.342
(58) Field of Classification Search ............ 438/3, 438/240, 250–256, 393–399, 238, 381
See application file for complete search history.

(56) References Cited

U.S. PATENT DOCUMENTS

| | | | |
|---|---|---|---|
| 6,103,567 A | 8/2000 | Shih et al. | 438/251 |
| 6,143,598 A | 11/2000 | Martin et al. | 438/240 |
| 6,291,288 B1* | 9/2001 | Huang et al. | 438/239 |
| 2002/0000590 A1* | 1/2002 | Yamamichi | 257/296 |
| 2003/0020122 A1* | 1/2003 | Joo et al. | 257/381 |
| 2003/0235968 A1* | 12/2003 | Oh et al. | 438/396 |
| 2004/0040494 A1* | 3/2004 | Vaartstra et al. | 117/104 |
| 2004/0161890 A1* | 8/2004 | Song et al. | 438/240 |
| 2005/0037630 A1* | 2/2005 | Doh et al. | 438/785 |

FOREIGN PATENT DOCUMENTS

KR  2003-0054054 A  2/2007

* cited by examiner

*Primary Examiner*—H. Jey Tsai
(74) *Attorney, Agent, or Firm*—Mills & Onello LLP (57) ABSTRACT

There is provided a method of fabricating an analog capacitor using a post-treatment technique. The method includes forming a lower insulating layer on a semiconductor substrate. A bottom electrode is formed on the lower insulating layer, and a capacitor dielectric layer is formed on the bottom electrode. Then, the capacitor dielectric layer is post-treated in a deoxidizing medium. Then, the post-treated capacitor dielectric layer is post-treated in an oxidizing medium. A top electrode is formed on the post-treated capacitor dielectric layer. The analog capacitor fabricated through the post-treatment as above has a low VCC.

11 Claims, 6 Drawing Sheets

METHOD OF FABRICATING ANALOG CAPACITOR USING POST-TREATMENT TECHNIQUE

CROSS-REFERENCE TO RELATED APPLICATION

This application claims the benefit of Korean Patent Application No. 2004-12398, filed Feb. 24, 2004, the disclosure of which is hereby incorporated herein by reference in its entirety.

BACKGROUND OF THE INVENTION

1. Technical Field

The present invention relates to a method of fabricating an analog capacitor, and more particularly, to a method of fabricating an analog capacitor using a post-treatment technique.

2. Discussion of the Related Art

An analog capacitor is a unit element that is commonly used in an analog to digital (AD) converter, an RF device, a switching capacitor filter, a CMOS image sensor, or the like. The analog capacitor stores information in analog form, and has the property that the quantity of stored electric charge is varied, depending on the applied voltage.

Further, it is preferable that such an analog capacitor should demonstrate the properties of a low voltage coefficient of capacitance (VCC) and a low leakage current. The VCC required is a small level in its absolute value. Hereinafter, the value of the VCC refers to a dimension of its absolute value. In order to improve the VCC property, a capacitor having a poly-insulator-poly (PIP) structure has been replaced with an analog capacitor having a metal-insulator-metal (MIM) structure. However, such a capacitor having the MIM structure still exhibits a relatively high VCC.

Therefore, efforts have been made toward post-treating the bottom electrode and the dielectric layer of the capacitor in order to reduce the leakage current of the capacitor. A method of post-treating the lower electrode and/or the capacitor dielectric layer is disclosed in U.S. Pat. No. 6,143,598 entitled "Method of fabrication of low leakage capacitor" to Martin, et al., and also, in U.S. Pat. No. 6,103,567 entitled "Method of fabricating dielectric layer" to Shih, et al.

The method disclosed by Martin, et al. includes depositing a first electrode of a capacitor. The first electrode is plasma-treated in an oxidizing medium where nitrogen and oxygen are present. Then, a dielectric layer is deposited, and the dielectric layer is plasma-treated in an oxidizing medium where nitrogen and oxygen are present. Then, a top electrode of a capacitor is formed. Further, dinitrogen oxide ($N_2O$) may be used to plasma-treat the electrode. In the meantime, the method disclosed by Shih, et al. includes forming a high-k dielectric layer such as a tantalum oxide layer ($Ta_2O_5$), and performing a plasma-treatment or a deep ultra-violet ozone treatment.

According to these methods, the dielectric layer is post-treated in an oxidizing medium where nitrogen and oxygen are present, or treated with oxygen plasma or ozone, thereby reducing a leakage current. However, the methods do not achieve a reduction in the VCC property of the analog capacitor.

SUMMARY OF THE INVENTION

The present invention is directed to a method of fabricating an analog capacitor for reducing VCC, while preventing an increase in the leakage current of the capacitor.

In one aspect, the present invention is directed to a method of fabricating an analog capacitor using a post-treatment technique. The method includes forming a lower insulating layer on a semiconductor substrate. A bottom electrode is formed on the lower insulating layer, and a capacitor dielectric layer is formed on the bottom electrode. Then, the capacitor dielectric layer is post-treated in a deoxidizing medium. Then, the post-treated capacitor dielectric layer is post-treated in an oxidizing medium. A top electrode is formed on the post-treated capacitor dielectric layer. Since the capacitor dielectric layer is post-treated in a deoxidizing medium and an oxidizing medium sequentially, there is provided an analog capacitor having low leakage current and low VCC.

The post-treatment of the capacitor dielectric layer in a deoxidizing medium may be performed using $H_2$, $H_2$-plasma, $N_2$, $N_2$-plasma, $NH_3$, $NH_3$-plasma, $N_2O$, or $N_2O$-plasma gas, and preferably, may be performed using $NH_3$-plasma gas. The $N_2O$ or $N_2O$-plasma gas may provide an oxidizing medium in accordance with the type of capacitor dielectric layer. However, in the case that the capacitor dielectric layer is an oxide layer, the $N_2O$ or $N_2O$-plasma gas provides a deoxidizing medium.

Further, the post-treatment of the post-treated capacitor dielectric layer in an oxidizing medium may be performed using $O_2$, $O_3$, or $O_2$-plasma gas, and preferably, may be performed using $O_3$ gas.

Further, before the capacitor dielectric layer is formed on the bottom electrode, the bottom electrode may be post-treated in a deoxidizing medium. Further, before the bottom electrode is post-treated in a deoxidizing medium, the bottom electrode may be post-treated in an oxidizing medium.

Further, the capacitor dielectric layer may be formed depositing a dielectric material using a thermal decomposition technique in a reactant-free state. Thus, a relative amount of the carbon (C) atoms contained inside the capacitor dielectric layer is reduced, thereby reducing VCC.

Further, the formation of the capacitor dielectric layer may include forming a lower capacitor dielectric layer. The post-treatment of the lower capacitor dielectric layer in a deoxidizing medium and an oxidizing medium sequentially may be performed at least one time. Thus, the VCC of the analog capacitor can be reduced.

In another aspect, the present invention is directed to a method of fabricating an analog capacitor. A lower insulating layer is formed on a semiconductor substrate. A bottom electrode is formed on the lower insulating layer. A lower capacitor dielectric layer is formed on the bottom electrode. The lower capacitor dielectric layer is post-treated in a deoxidizing medium and an oxidizing medium sequentially at least one time. An upper capacitor dielectric layer is formed on the post-treated lower capacitor dielectric layer. The upper capacitor dielectric layer is post-treated in a deoxidizing medium. The post-treated upper capacitor dielectric layer is then post-treated in an oxidizing medium. A top electrode is formed on the post-treated upper capacitor dielectric layer.

In another aspect, the present invention is directed to a method of fabricating an analog capacitor. A lower insulating layer is formed on a semiconductor substrate. A bottom electrode is formed on the lower insulating layer. A capacitor dielectric layer is formed on the bottom electrode. The capacitor dielectric layer is post-treated using $NH_3$-plasma. The post-treated capacitor dielectric layer is post-treated in an oxidizing medium. A top electrode is formed on the post-treated capacitor dielectric layer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Figure 1:
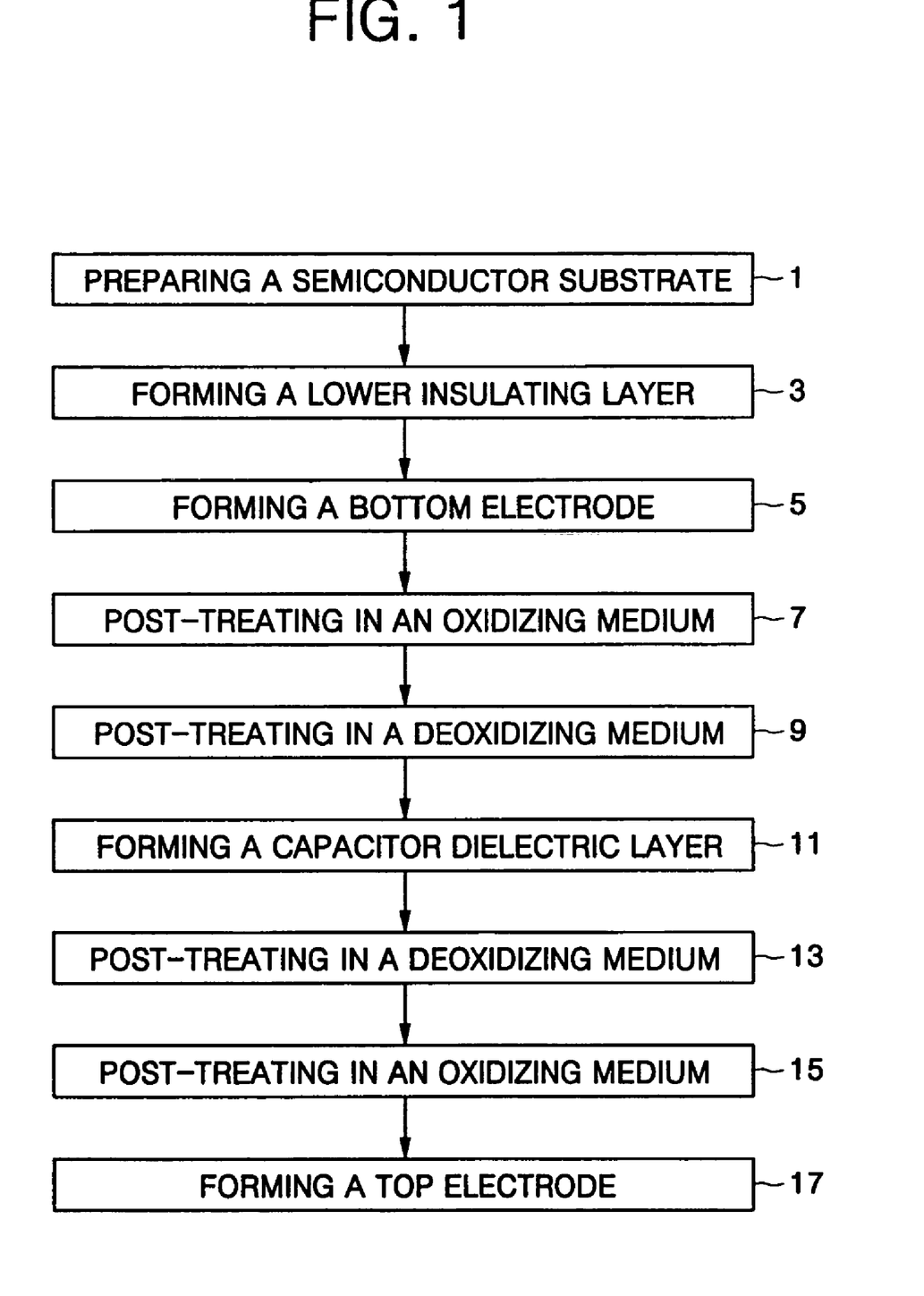
FIG. 1 is a process sequence diagram illustrating a method of fabricating an analog capacitor according to an embodiment of the present invention.
Figure 2:
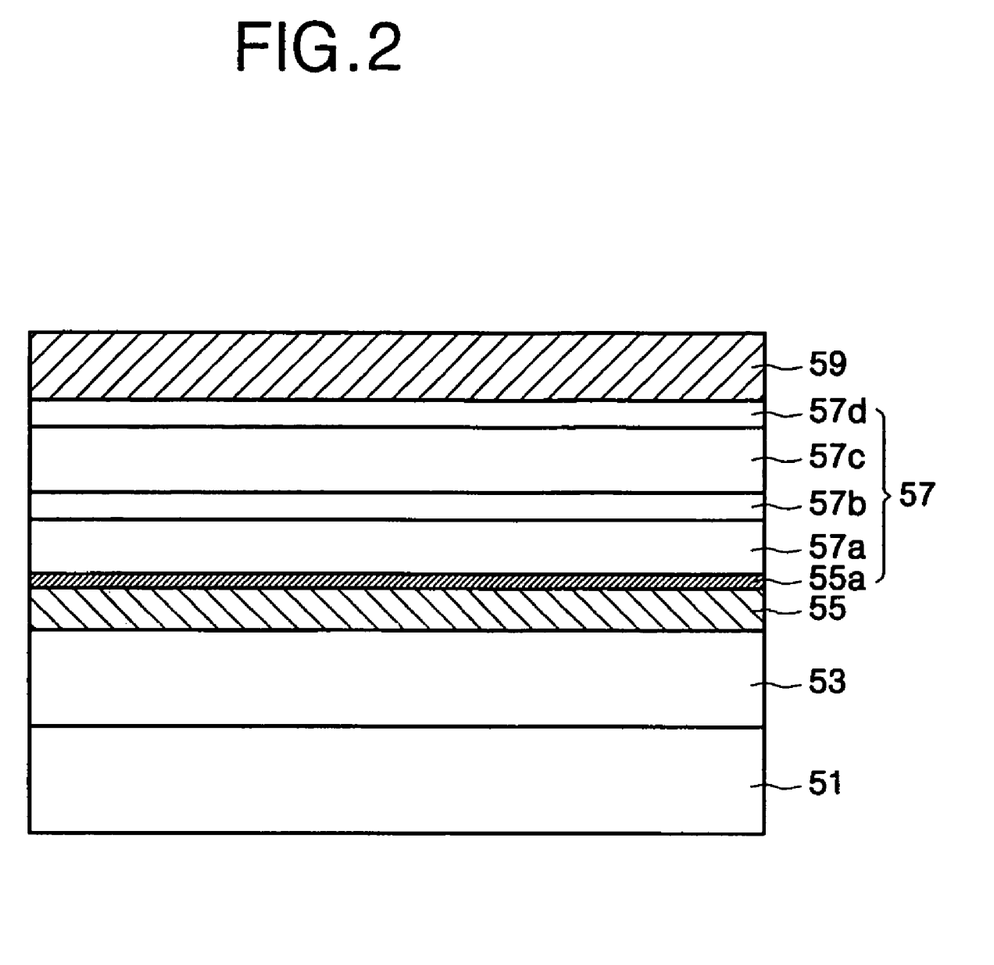
FIG. 2 is a sectional view illustrating a method of fabricating an analog capacitor according to an embodiment of the present invention.

FIG. 1 is a process sequence diagram illustrating a method of fabricating an analog capacitor according to an embodiment of the present invention, and FIG. 2 is a sectional view illustrating a method of fabricating an analog capacitor according to an embodiment of the present invention.

Referring to FIGS. 1 and 2, a semiconductor substrate 51 is prepared (step 1 of FIG. 1). Discrete devices such as transistors (not shown), and metal interconnections are formed on the semiconductor substrate 51.

A lower insulating layer 53 is formed on the semiconductor substrate 51 (step 3 of FIG. 1). The lower insulating layer 53 insulates the discrete devices and the metal interconnections from an analog capacitor to be formed thereon. The lower insulating layer 53 may have openings for exposing the semiconductor substrate in order to electrically connect the metal interconnections and the analog capacitor.

A bottom electrode 55 is formed on the lower insulating layer 53 (step 5 of FIG. 1). The bottom electrode 55 may be formed of a single layer or multiple layers. The bottom electrode 55 may be composed, for example, of aluminum (Al), copper (Cu), iridium (Ir), iridium oxide ($IrO_2$), platinum (Pt), polysilicon (Poly-Si), ruthenium (Ru), ruthenium oxide ($RuO_2$), titanium (Ti), titanium nitride (TiN), tantalum (Ta), tantalum nitride (TaN), tungsten or tungsten nitride (WN), or may be composed of at least two or more of them.

Preferably, the bottom electrode 55 is post-treated in a deoxidizing medium (step 9 of FIG. 1). The post-treatment of the bottom electrode 55 in a deoxidizing medium is performed, for example, using $H_2$, $H_2$-plasma, $N_2$, $N_2$-plasma, $NH_3$, $NH_3$-plasma, $N_2O$, or $N_2O$-plasma gas, and preferably, $NH_3$-plasma gas may be used.

Further, before the bottom electrode 55 is post-treated in a deoxidizing medium, the bottom electrode 55 is optionally post-treated in an oxidizing medium (step 7 of FIG. 1). The post-treatment of the bottom electrode 55 in an oxidizing medium is performed, for example, using $O_2$, $O_3$, or $O_2$-plasma gas, and preferably, is performed using $O_3$ gas.

When post-treating the bottom electrode 55 in a deoxidizing medium, or post-treating in an oxidizing medium and then in a deoxidizing medium sequentially, a bottom electrode post-treatment layer 55a may be formed on the bottom electrode 55.

A capacitor dielectric layer 57 is formed on the semiconductor substrate having the post-treated bottom electrode 55 (step 11 of FIG. 1). The capacitor dielectric layer 57 is preferably formed of a high-k dielectric layer, which is composed of a material such as tantalum oxide ($Ta_2O_5$), alumina oxide ($Al_2O_3$), hafnium oxide ($HfO_2$), zirconium oxide ($ZrO_2$), titanium oxide ($TiO_2$), or barium-strontium titanium oxide (BST). Further, the capacitor dielectric layer 57 is not limited to a single layer, but can be optionally formed of multiple layers. Preferably, the capacitor dielectric layer 57 is formed to a thickness in the range of 50 to 1000 Å.

The capacitor dielectric layer 57 is formed, in one embodiment, using a chemical vapor deposition (CVD) technique. Preferably, the capacitor dielectric layer 57 is formed using a thermal decomposition technique in a reactant-free state. In the case where the capacitor dielectric layer 57 is formed of multiple layers, at least one layer of the multiple layers can be formed using a thermal decomposition technique. Since the dielectric layer is formed using a thermal decomposition technique in a reactant-free state, the relative amount of the carbon atoms contained in the capacitor dielectric layer 57 can therefore be reduced. Since the amount of the carbon atoms contained in the capacitor dielectric layer 57 is relatively small, it is possible to fabricate an analog capacitor which exhibits a low VCC property.

Further, the formation of the capacitor dielectric layer 57 includes, in one embodiment, forming a lower capacitor dielectric layer 57a. The lower capacitor dielectric layer 57a may be formed of a high-k dielectric layer as described above. The lower capacitor dielectric layer 57a is post-treated in a deoxidizing medium and in an oxidizing medium sequentially at least one time. As a result, a post-treated lower capacitor dielectric layer 57b is formed on the lower capacitor dielectric layer 57a. Then, an upper capacitor dielectric layer 57c is formed on the post-treated lower capacitor dielectric layer 57b. The upper capacitor dielectric layer 57c is, in one embodiment, composed of the same material as the lower capacitor dielectric layer 57a.

The capacitor dielectric layer 57 is post-treated in a deoxidizing medium (step 13 of FIG. 1). The post-treatment of the capacitor dielectric layer 57 may be performed using $H_2$, $H_2$-plasma, $N_2$, $N_2$-plasma, $NH_3$, $NH_3$-plasma, $N_2O$, or $N_2O$-plasma gas, and preferably, may be performed using $NH_3$-plasma gas.

The post-treated capacitor dielectric layer 57, which is post-treated in a deoxidizing medium, is post-treated in an oxidizing medium (step 15 of FIG. 1). The post-treatment of the capacitor dielectric layer 57 in an oxidizing medium may be performed using $O_2$, $O_3$, or $O_2$-plasma gas, and preferably, may be performed using $O_3$ gas. As such, since the capacitor dielectric layer 57 is post-treated in an oxidizing medium after post-treated in a deoxidizing medium, the capacitor can be formed to exhibit both a low leakage current and a low VCC property. When the capacitor dielectric layer 57 is post-treated in a deoxidizing medium and an oxidizing medium, a post-treated capacitor dielectric layer 57d is formed on the capacitor dielectric layer 57.

A top electrode 59 is formed on the capacitor dielectric layer 57, which is post-treated in an oxidizing medium (step 17 of FIG. 1). The top electrode 59 may be composed of aluminum (Al), copper (Cu), iridium (Ir), iridium oxide ($IrO_2$), platinum (Pt), polysilicon (Poly-Si), ruthenium (Ru), ruthenium oxide ($RuO_2$), titanium (Ti), titanium nitride (TiN), tantalum (Ta), tantalum nitride (TaN), tungsten or tungsten nitride (WN), or may be composed of at least two or more of them. As a result, the formation of the analog capacitor is completed.

EXAMPLES

Hereinafter, description will be made with reference to various measurement results of the samples fabricated under different post-treatment conditions for a bottom electrode or a capacitor dielectric layer, and different formation methods of a capacitor dielectric layer.

Figure 3A:
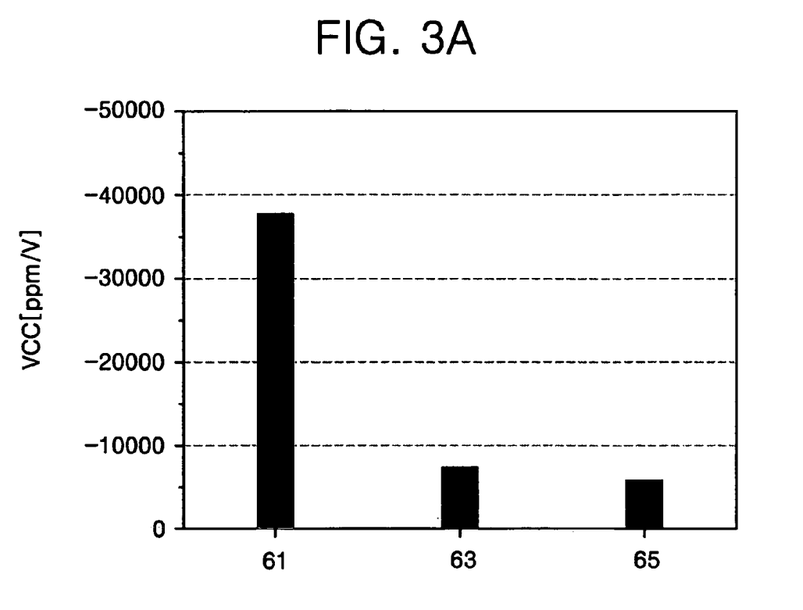
FIGS. 3A and 3B are graphs illustrating VCC properties and leakage current densities of samples fabricated under the different post-treatment conditions for the bottom electrode of each sample according to the present invention.
Figure 3B:
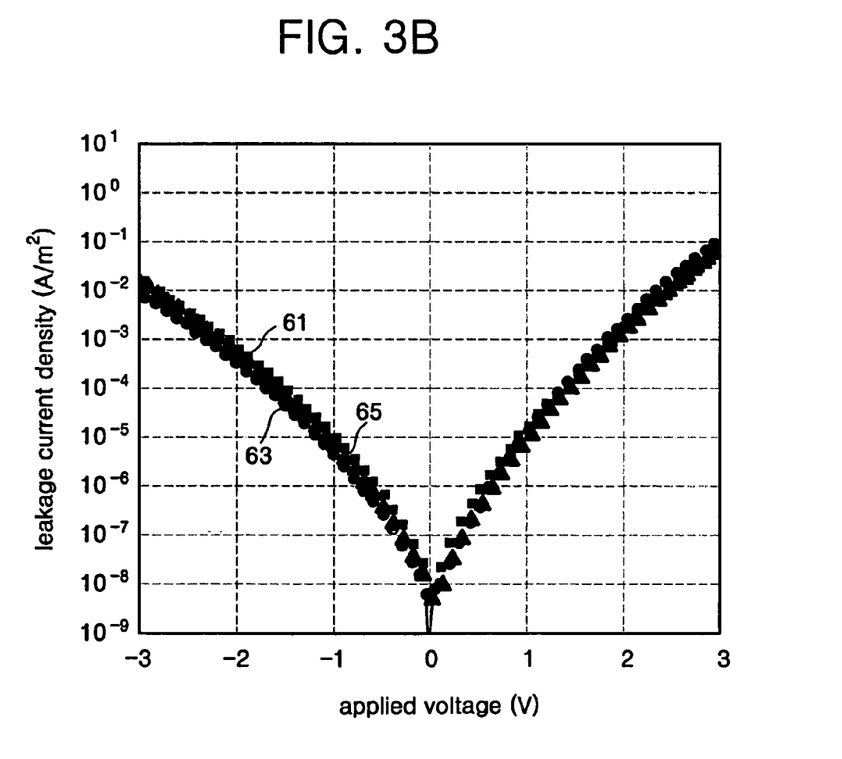

FIGS. 3A and 3B are graphs illustrating VCC properties and leakage current densities of the samples fabricated under the different post-treatment conditions for the bottom electrode of each sample according to the present invention. The fabrication recipes of the samples with different post-treatment conditions for the bottom electrode are shown in Table 1.

TABLE 1

| sample | bottom electrode | post-treatment conditions | capacitor dielectric layer | top electrode |
|---|---|---|---|---|
| reference sample (61) | TiN | — | $Ta_2O_5$ 150 Å | TiN |
| first sample (63) | | $NH_3$-plasma treatment | | |
| second sample (65) | | $O_3$ treatment + $NH_3$-plasma treatment | | |

Referring to Table 1, in each sample, a bottom electrode is formed, and then, the bottom electrode is post-treated under a post-treatment condition, which is varied in accordance with the samples. Specifically, whereas the reference sample 61 is fabricated without a post-treatment, the first sample 63 is post-treated using $NH_3$-plasma gas, and the second sample 65 is post-treated using $O_3$ gas, and then, post-treated using $NH_3$-plasma gas.

In each sample shown in Table 1, a bottom electrode and a top electrode are composed of TiN. Further, a lower capacitor dielectric layer is composed of $Ta_2O_5$ with a thickness of 90 Å, and post-treated using $O_3$ gas. Then, an upper capacitor dielectric layer is formed on the lower capacitor dielectric layer, and the upper capacitor dielectric layer is composed of $Ta_2O_5$ with a thickness of 60 Å, and post-treated using $O_3$ gas.

Then, a capacitance of each sample is measured in response to varying applied voltages to be compared, at an AC voltage frequency of 100 KHz. The resulting capacitance relative to the applied voltages is shown as a quadratic function. Then, a coefficient of the linear term in the quadratic function of each sample was compared. In each sample, leakage currents for the applied voltages are measured at a temperature of 125° C.

Referring to FIG. 3A, the reference sample 61, in which the post-treatment of the bottom electrode was not performed, exhibited a relatively high VCC property. On the contrary, the first sample 63, which is post-treated using $NH_3$-plasma gas, and the second sample 65, which is post-treated using $O_3$ gas and $NH_3$-plasma gas sequentially, demonstrated relatively low VCC properties. The second sample 65 demonstrated a lower VCC than that of the first sample 63, but the difference between the two samples 65, 63 was relatively small.

Referring to FIG. 3B, the leakage current densities of the samples 61, 63, 65 exhibited little difference.

Through the above illustration, it was determined that the VCC of the sample can be reduced when the bottom electrode is post-treated using $NH_3$-plasma gas, or post-treated using $O_3$ gas and then, using $NH_3$-plasma gas.

Figure 4A:
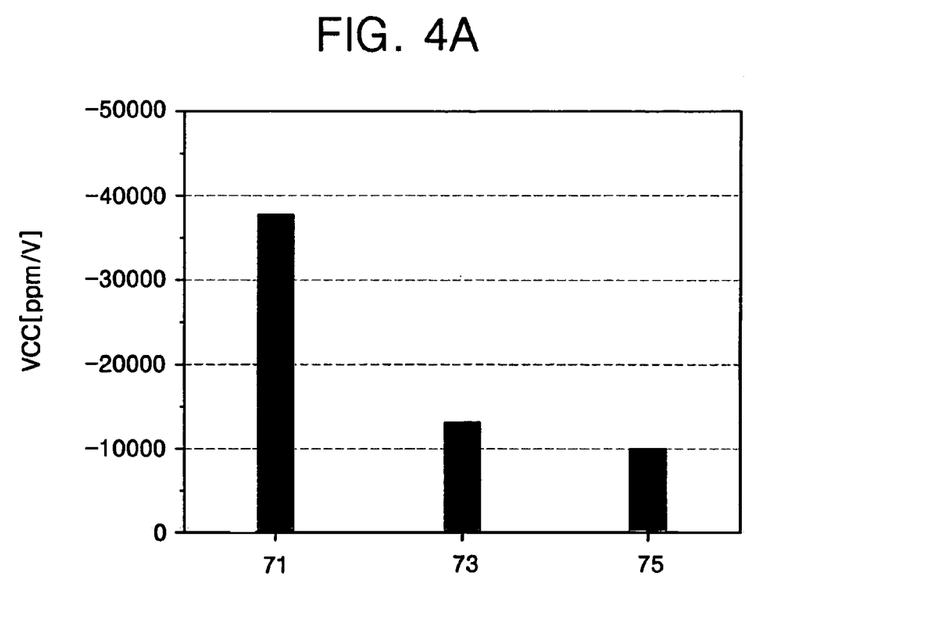
FIGS. 4A and 4B are graphs illustrating VCC properties and leakage current densities of the samples fabricated under the different post-treatment conditions for the capacitor dielectric layer of each sample according to the present invention.
Figure 4B:
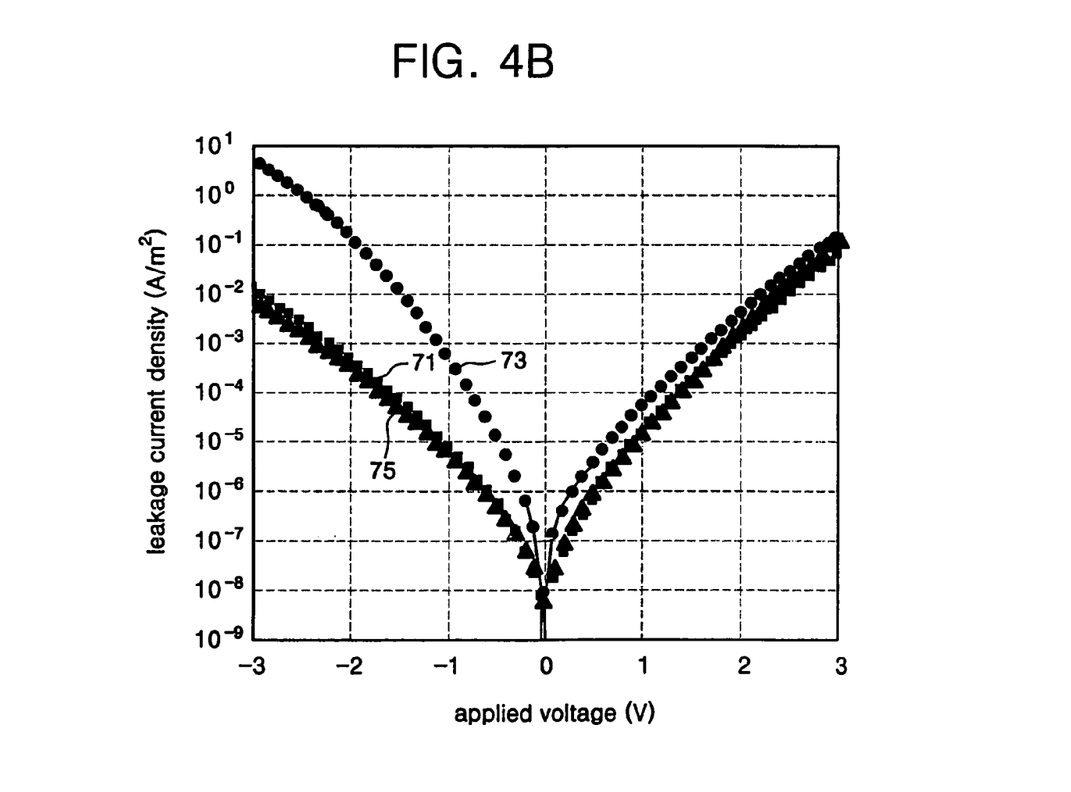

FIGS. 4A and 4B are graphs illustrating VCC properties and leakage current densities of the samples fabricated under the different post-treatment conditions for the capacitor dielectric layer of each sample according to the present invention. Further, fabrication recipes of the samples with different post-treatment conditions of the capacitor dielectric layer are shown in Table 2.

TABLE 2

| sample | bottom electrode | capacitor dielectric layer | post-treatment conditions for dielectric layer | top electrode |
|---|---|---|---|---|
| reference sample (71) | TiN | $Ta_2O_5$ 150 Å | $O_3$ treatment | TiN |
| third sample (73) | | | $O_3$ treatment + $NH_3$-plasma treatment | |
| fourth sample (75) | | | $NH_3$-plasma treatment + $O_3$ treatment | |

Referring to Table 2, in each sample, a bottom electrode and a capacitor dielectric layer are formed, and then, the capacitor dielectric layer is post-treated under a post-treatment condition, which is varied in accordance with the samples. Specifically, the reference sample 71 is post-treated using $O_3$ gas, and the third sample 73 is post-treated using $O_3$ gas and $NH_3$-plasma gas sequentially. The fourth sample 75 is post-treated using $NH_3$-plasma gas, and then, post-treated using $O_3$ gas. In this example, the reference sample 71 is fabricated using the same fabrication recipe as that of the reference sample 61 in Table 1.

In each sample, a bottom electrode and a top electrode of the capacitor are composed of TiN. The post-treatment of the bottom electrode in each sample was omitted. In the capacitor dielectric layer of each sample of Table 2, a lower capacitor dielectric layer is composed of $Ta_2O_5$ with a thickness of 90 Å, and post-treated using $O_3$ gas. Then, an upper capacitor dielectric layer is formed on the lower capacitor dielectric layer, and the upper capacitor dielectric layer is composed of $Ta_2O_5$ with a thickness of 60 Å.

In each of the samples, capacitances and leakage currents are measured under the same conditions as those described in reference to Table 1.

Referring to FIG. 4A, the reference sample 71, which is post-treated using $O_3$ gas, exhibited a relatively high VCC. On the contrary, the third sample 73, which is post-treated using $O_3$ gas and $NH_3$-plasma gas sequentially, and the fourth sample 75, which is post-treated using $NH_3$-plasma gas and $O_3$ gas sequentially, exhibited relatively low VCC properties. The fourth sample 75 exhibited a lower VCC than that of the third sample 73, but the difference between the two was small.

Referring to FIG. 4B, the fourth sample 75, which is post-treated using $NH_3$-plasma gas and $O_3$ gas sequentially, exhibited a leakage current density similar to that of the reference sample 71, which is post-treated using $O_3$ gas. However, the third sample 73, which is post-treated using $O_3$ gas and $NH_3$-plasma gas sequentially, exhibited a relatively high leakage current density.

Therefore, the capacitor dielectric layer is post-treated using $NH_3$-plasma gas and $O_3$ gas sequentially, thereby reducing the VCC property without causing an increase in a leakage current density. Meanwhile, in the case of post-treating the capacitor dielectric layer using $O_3$ gas and then, using $NH_3$-plasma gas, the VCC property is reduced, but leakage current density is increased.

Figure 5A:
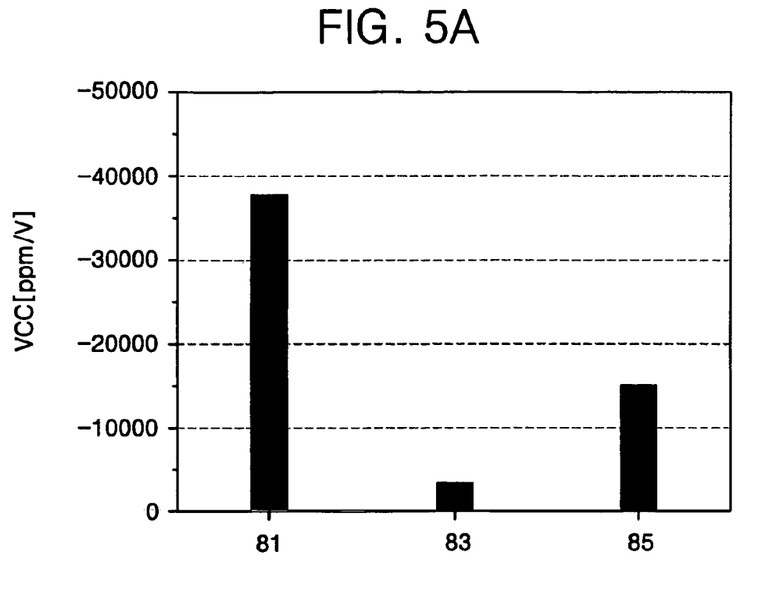
FIGS. 5A and 5B are graphs illustrating VCC properties and leakage current densities of the samples fabricated under the different post-treatment conditions for the lower capacitor dielectric layer and the upper capacitor dielectric layer of each sample according to the present invention.
Figure 5B:
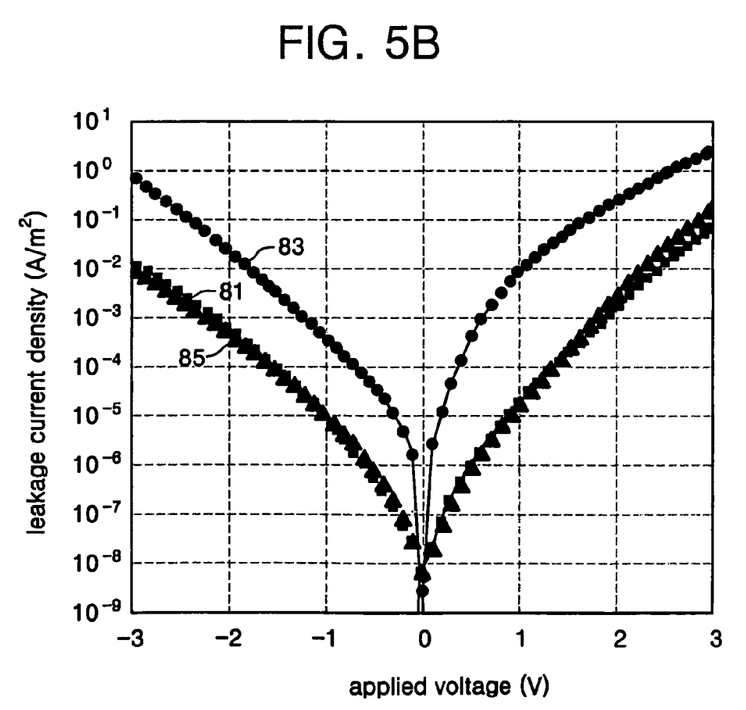

FIGS. 5A and 5B are graphs illustrating VCC properties and leakage current densities of the samples fabricated under the different post-treatment conditions for the lower capacitor dielectric layer and the upper capacitor dielectric layer of each sample according to the present invention. Further, fabrication recipes of the samples with different post-treatment conditions of the lower and the upper capacitor dielectric layer are shown in Table 3.

TABLE 3

| Sample | Bottom electrode | post-treatment conditions | top electrode | post-treatment conditions |
|---|---|---|---|---|
| reference sample (81) | $Ta_2O_5$ 90 Å | $O_3$ treatment | $Ta_2O_5$ 60 Å | $O_3$ treatment |
| fifth sample (83) | | $NH_3$-plasma treatment | | $NH_3$-plasma treatment |
| Sixth sample (85) | | $NH_3$-plasma treatment + $O_3$ treatment | | $NH_3$-plasma treatment + $O_3$ treatment |

Referring to Table 3, in each sample, a bottom electrode and a lower capacitor dielectric layer are formed, and then, the lower capacitor dielectric layer is post-treated under a post-treatment condition, which is varied in accordance with the samples. Specifically, the lower capacitor dielectric layer of the reference sample 81 is post-treated using $O_3$ gas, and the lower capacitor dielectric layer of the fifth sample 83 is post-treated using $NH_3$-plasma gas. The lower capacitor dielectric layer of the sixth sample 85 is post-treated using $NH_3$-plasma gas, and $O_3$ gas sequentially. Further, an upper capacitor dielectric layer is formed on the post-treated lower capacitor dielectric layer, and the upper capacitor dielectric layer is post-treated with different post-treatment condition. In each sample, a bottom electrode and a top electrode are composed of TiN. The post-treatment of the bottom electrode in each sample was omitted. Further, the reference sample 81 is fabricated under the same conditions as those of the reference sample 61 of Table 1.

In each of the samples, capacitances and leakage currents are measured under the same conditions as those described in reference to Table 1.

Referring to FIG. 5A, the reference sample 81, which is fabricated by post-treating a lower capacitor dielectric layer and by post-treating an upper capacitor dielectric layer, using $O_3$ gas, exhibited a relatively high VCC. On the contrary, the fifth sample 83, which is fabricated by post-treating a lower capacitor dielectric layer and by post-treating an upper capacitor dielectric layer, using $NH_3$-plasma gas, exhibited a relatively low VCC. Further, the sixth sample 85, which is fabricated by post-treating a lower capacitor dielectric layer and by post-treating an upper capacitor dielectric layer, using $NH_3$-plasma gas and $O_3$ gas sequentially, exhibited a VCC being lower than that of the reference sample 81, and higher than that of the fifth sample 83.

Referring to FIG. 5B, the sixth sample 85, which is fabricated by respectively post-treating the lower and upper capacitor dielectric layers using $NH_3$-plasma gas and $O_3$ gas sequentially, exhibited a leakage current density similar to that of the reference sample 81, which is fabricated by respectively post-treating the lower and upper capacitor dielectric layers using $O_3$ gas. However, the fifth sample 83, which is fabricated by respectively post-treating the lower and upper capacitor dielectric layers using $NH_3$-plasma gas, exhibited a relatively high leakage current density.

Therefore, by respectively post-treating the lower and upper capacitor dielectric layers using $NH_3$-plasma gas and $O_3$ gas sequentially, the VCC property was reduced without an increase in leakage current density. Meanwhile, in the case of not performing the post-treatment of the lower and upper capacitor dielectric layers using $O_3$ gas, and post-treating them using $NH_3$-plasma gas, the VCC property is reduced, but leakage current density is increased.

Figure 6A:
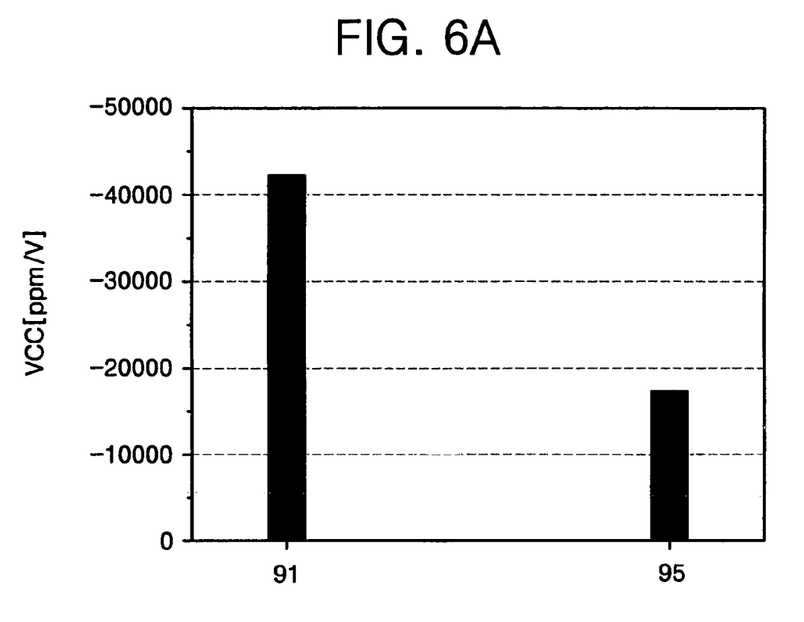
FIGS. 6A and 6B are graphs illustrating VCC properties and leakage current densities of the samples fabricated according to the present invention, in which the capacitor dielectric layers of the samples are deposited by different deposition methods.
Figure 6B:
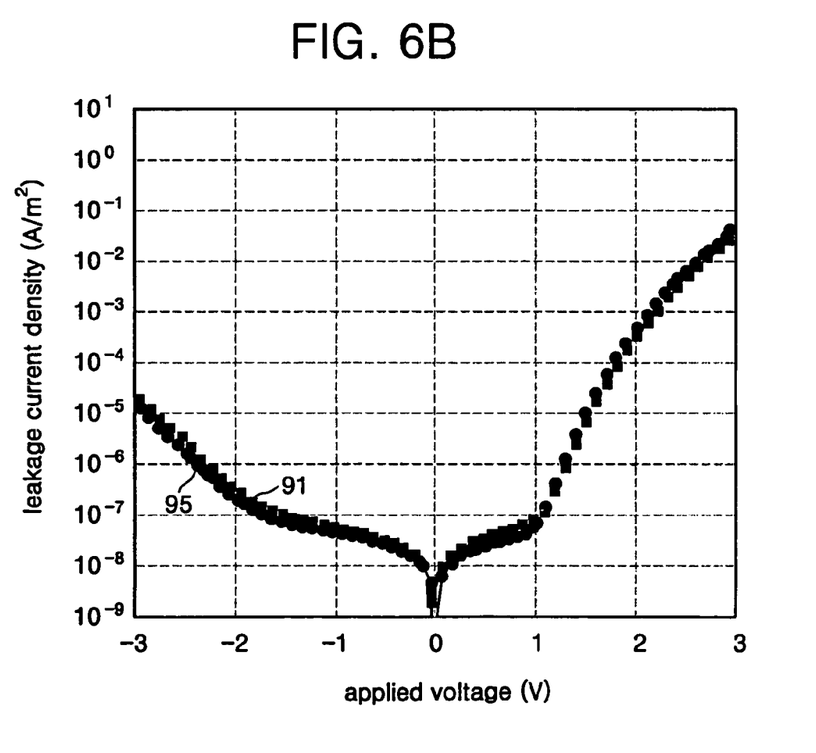

FIGS. 6A and 6B are graphs illustrating VCC properties and leakage current densities of the samples fabricated according to the present invention, in which the capacitor dielectric layers of the samples are deposited by different deposition methods. Further, fabrication recipes of the samples with different post-treatment conditions of the capacitor dielectric layer are shown in Table 4.

Referring to Table 4, in each sample, a bottom electrode is formed, and then, a capacitor dielectric layer is formed, the lower capacitor dielectric layer of which is formed through a deposition technique, which is varied in accordance with the samples. In specific, the capacitor dielectric layer of the seventh sample 91 is formed using a CVD technique. In the formation, $O_2$ gas is used as a reactant gas. Meanwhile, the capacitor dielectric layer of the eighth sample 95 is formed using a thermal decomposition of a CVD technique. Further, the capacitor dielectric layer of the eighth sample 95 is formed by depositing a dielectric material in the reactant-free state.

TABLE 4

| sample | Bottom electrode | capacitor dielectric layer | reactant gas | top electrode |
|---|---|---|---|---|
| seventh sample (91) | TiN | $Ta_2O_5$ 150 Å | $O_2$ | TiN |
| eighth sample (95) | | | — | |

Further, in each sample, the capacitor dielectric layer is post-treated using $O_3$ gas. Then, a top electrode is formed on the post-treated capacitor dielectric layer. In each sample, the bottom electrode and the top electrode are composed of TiN, and the post-treatment of the bottom electrode is skipped.

In each of the samples, capacitances and leakage currents are measured under the same conditions as those described in reference to Table 1.

Further, an XPS analysis was performed in order to compare a relative amount of the atoms contained inside the capacitor dielectric layer of each sample in accordance with the deposition technique, and the results are shown in Table 5.

TABLE 5

| reactant gas | C | Ta | O | Cl |
|---|---|---|---|---|
| $O_2$ | 20.5% | 23.7% | 55.8% | — |
| reactant-free | 16.2% | 25.1% | 58.7% | — |

Referring to Table 5, the capacitor dielectric layer formed using a reactant $O_2$ gas contains a higher amount of carbon (C) atoms than that of the capacitor dielectric layer formed by a thermal decomposition technique in the reactant-free state. Further, the capacitor dielectric layer formed using a reactant $O_2$ gas contains a lower amount of tantalum (Ta) and oxygen (O) atoms than that of the capacitor dielectric layer formed in the reactant-free state. However, the ratio of oxygen atoms relative to tantalum atoms was 2.35 and 2.34 in the two cases, which exhibited little difference.

Referring to FIG. 6A, the seventh sample 91, which is fabricated by forming the capacitor dielectric layer using a reactant gas, $O_2$, exhibited a higher VCC than that of the eighth sample 95, which is fabricated using a thermal decomposition technique in a reactant-free state. It is judged that the XPS analysis is caused due to the carbon atoms contained inside the capacitor dielectric layer.

Referring to FIG. 6B, leakage current densities of the seventh sample 91 and the eighth sample 95 exhibited little difference.

Therefore, when the capacitor dielectric layer is formed in a reactant-free state, the VCC property can be reduced without causing an increase in leakage current density.

According to the present invention, a capacitor dielectric is post-treated under the conditions of a deoxidizing medium and an oxidizing medium sequentially, thereby reducing a VCC property, while preventing an increase of leakage current in an analog capacitor.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of fabricating an analog capacitor comprising:
    forming a lower insulating layer on a semiconductor substrate;
    forming a bottom electrode on the lower insulating layer;
    before beginning to form a capacitor dielectric layer on the formed bottom electrode, post-treating the formed bottom electrode in an oxidizing medium that achieves a reduction in a low voltage coefficient of capacitance of the resulting analog capacitor;
    following post-treating the formed bottom electrode in the oxidizing medium and before begining to form the capacitor dielectric layer on the formed bottom electrode, post-treating the bottom electrode in a deoxidizing medium;
    forming the capacitor dielectric layer on the post-treated bottom electrode;
    post-treating the capacitor dielectric layer in a deoxidizing medium;
    following post-treating the capacitor dielectric layer in the deoxidizing medium, post-treating the post-treated capacitor dielectric layer in an oxidizing medium; and
    following post-treating the post-treated capacitor dielectric layer, forming a top electrode on the post-treated capacitor dielectric layer.

2. The method according to claim 1, wherein post-treating the capacitor dielectric layer in a deoxidizing medium is performed using at least one gas selected from the group consisting of $H_2$, $H_2$-plasma, $N_2$, $N_2$-plasma, $NH_3$, $NH_3$-plasma, $N_2O$, and $N_2O$-plasma gas.

3. The method according to claim 1, wherein post-treating the capacitor dielectric layer in an oxidizing medium is performed using at least one gas selected from the group consisting of $O_2$, $O_3$, and $O_2$-plasma.

4. The method according to claim 1, wherein forming the capacitor dielectric layer includes depositing a dielectric material using a thermal decomposition technique in a reactant-free state.

5. A method of fabricating an analog capacitor comprising:
    forming a lower insulating layer on a semiconductor substrate;
    forming a bottom electrode on the lower insulating layer;
    before beginning to form a lower capacitor dielectric layer on the formed bottom electrode, post-treating the formed bottom electrode in an oxidizing medium that achieves a reduction in a low voltage coefficient of capacitance of the resulting analog capacitor;
    following post-treating the formed bottom electrode in the oxidizing medium and before beginning to form the lower capacitor dielectric layer on the formed bottom electrode, post-treating the bottom electrode in a deoxidizing medium;
    forming the lower capacitor dielectric layer on the post-treated bottom electrode;
    post-treating the lower capacitor dielectric layer in a deoxidizing medium and an oxidizing medium sequentially at least one time;
    forming an upper capacitor dielectric layer on the post-treated lower capacitor dielectric layer;
    post-treating the upper capacitor dielectric layer in a deoxidizing medium;
    following post-treating the upper capacitor dielectric layer in the deoxidizing medium, post-treating the post-treated upper capacitor dielectric layer in an oxidizing medium; and
    following post-treating the post-treated upper capacitor dielectric layer, forming a top electrode on the post-treated upper capacitor dielectric layer.

6. The method according to claim 5, wherein post-treating the lower capacitor dielectric layer and the upper capacitor dielectric layer in a deoxidizing medium are performed using at least one gas selected from the group consisting of $H_2$, $H_2$-plasma, $N_2$, $N_2$-plasma, $NH_3$, $NH_3$-plasma, $N_2O$, and $N_2O$-plasma gas.

7. The method according to claim 5, wherein post-treating the lower capacitor dielectric layer and the upper capacitor dielectric layer in a deoxidizing medium are performed using at least one gas selected from the group consisting of $O_2$, $O_3$, and $O_2$-plasma.

8. The method according to claim 5, wherein forming the lower and/or upper capacitor dielectric layer includes depositing a dielectric material using a thermal decomposition technique in a reactant-free state.

9. A method of fabricating an analog capacitor comprising:

forming a lower insulating layer on a semiconductor substrate;

forming a bottom electrode on the lower insulating layer;

before beginning to form a capacitor dielectric layer on the formed bottom electrode, post-treating the formed bottom electrode in an oxidizing medium that achieves a reduction in a low voltage coefficient of capacitance of the resulting analog capacitor;

following post-treating the formed bottom electrode in the oxidizing medium and before beginning to form the capacitor dielectric layer on the formed bottom electrode, post-treating the bottom electrode using $NH_3$-plasma;

forming the capacitor dielectric layer on the post-treated bottom electrode;

post-treating the capacitor dielectric layer using $NH_3$-plasma;

following post-treating the capacitor dielectric layer using $NH_3$-plasma, post-treating the post-treated capacitor dielectric layer in an oxidizing medium; and following post-treating the post-treated capacitor dielectric layer, forming a top electrode on the post-treated capacitor dielectric layer.

10. The method according to claim 9, wherein post-treating the post-treated capacitor dielectric layer in an oxidizing medium is performed using at least one gas selected from the group consisting of $O_2$, $O_3$, and $O_2$-plasma.

11. The method according to claim 9, wherein the bottom electrode and the top electrode are composed of TiN.

* * * * *